(12) United States Patent
Melik-Martirosian et al.

(10) Patent No.: US 6,735,124 B1
(45) Date of Patent: May 11, 2004

(54) FLASH MEMORY DEVICE HAVING FOUR-BIT CELLS

(75) Inventors: Ashot Melik-Martirosian, Santa Clara, CA (US); Sameer S. Haddad, San Jose, CA (US); Mark W. Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/315,632

(22) Filed: Dec. 10, 2002

(51) Int. Cl.$^7$ .............................................. G11C 16/04

(52) U.S. Cl. ............................ 365/185.28; 365/185.26; 365/185.33

(58) Field of Search ........................ 365/185.28, 185.26, 365/185.33, 185.15, 185.18

(56) References Cited

U.S. PATENT DOCUMENTS 5,903,494 A * 5/1999 Papadas et al. ........ 365/185.01

* cited by examiner

Primary Examiner—David Lam
(74) Attorney, Agent, or Firm—Renner, Otto, Boisselle & Sklar, LLP (57) ABSTRACT

A non-volatile memory device includes a semiconductor substrate having first and second bitlines buried therein. The first bitline serves as a source terminal and the second bitline serves as a drain terminal. An oxide-nitride-oxide (ONO) stack is formed over the substrate. The ONO stack includes a charge storing layer having at least four charge storing cells therein. A pair of complementary conductive regions are disposed on opposite sides of the ONO stack extending in a direction perpendicular to the first and second bitlines. A wordline, which serves as a gate electrode, is disposed above the ONO stack and laterally between the first and second complementary conductive regions.

23 Claims, 4 Drawing Sheets

Prior Art

FLASH MEMORY DEVICE HAVING FOUR-BIT CELLS

TECHNICAL FIELD

The present invention relates generally to the field of non-volatile memory devices and, more particularly, to a semiconductor/oxide-nitride-oxide on semiconductor (SONOS) type electrically erasable programmable read only memory (EEPROM) device having at least four charge storing cells and a method of programming the same.

BACKGROUND

A pervasive trend in modern integrated circuit manufacture is to increase the number of bits stored per unit area on an integrated circuit memory core that contains memory devices (sometimes referred to as memory cells), such as flash electrically erasable programmable read only memory (EEPROM) devices. For instance, a conventional semiconductor/oxide-nitride-oxide on semiconductor (SONOS) type memory device is capable of storing two bits of data in "double-bit" format. That is, one bit can be stored using a memory cell on a first side of the memory device and a second bit can be stored using a memory cell on a second side of the memory device.

Figure 1:
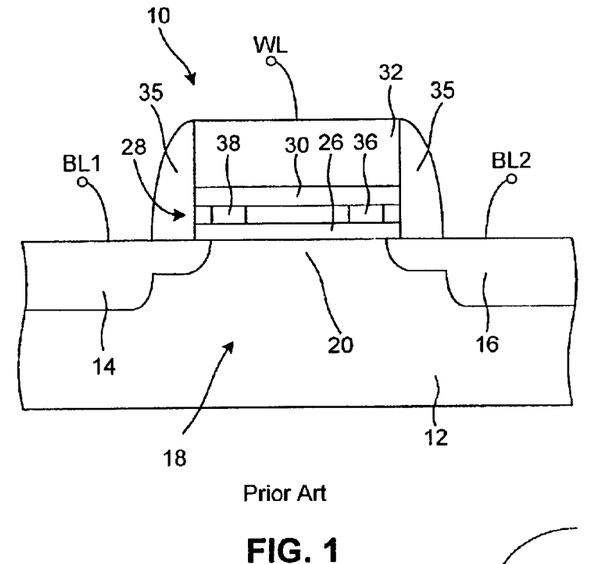
FIG. 1 is a schematic cross-section illustration of a conventional SONOS-type memory device capable of storing two bits.

For example, FIG. 1 illustrates a conventional, non-volatile, SONOS-type memory device 10, which includes a semiconductor substrate 12 having a source 14 and a drain 16 formed therein. A body 18 having a channel region 20 is formed between the source 14 and the drain 16. An oxide-nitride-oxide (ONO) dielectric stack is formed above the body 18. A polysilicon gate electrode 32 is formed over the ONO stack. The ONO stack includes a first or bottom dielectric layer 26 (often referred to as a bottom tunnel oxide), a charge storing layer 28, and a second or top dielectric layer 30. Within the charge storing layer 28, the conventional memory device 10 includes a first charge storing cell or normal bit 36 and a second charge storing cell or complementary bit 38.

The memory device 10 is operatively arranged to be programmed, read and erased by the application of appropriate voltage potentials. Typically, the gate electrode 32 can be coupled to a wordline (WL), the source 14 can be coupled to a first bitline (BL1), and the drain can be coupled to a second bitline (BL2) for applying the various voltage potentials to the corresponding components of the memory device.

Programming of such a SONOS device can be accomplished, for example, by hot electron injection. Hot electron injection involves applying appropriate voltage potentials to each of the gate electrode 32, the source 14, and the drain 16 of the SONOS memory device 10 for a specified duration until the charge storing layer 28 accumulates charge. Such a process, with respect to a NOR architecture SONOS device, is disclosed in co-owned U.S. Pat. No. 6,215,702, which is incorporated herein by reference in its entirety.

During hot electron injection, one or both of the charge storing cells 36, 38 within the charge storing layer 28 are programmed by applying appropriate potentials to the source 14, drain 16, and/or gate electrode 32. The applied potentials generate a vertical electric field through the top and bottom dielectric layers 30, 26 and the charge storing layer 28 as well as a lateral electric field along the length of the channel 20 from the source to the drain within the body 18. The lateral electric field causes electrons to be drawn off of the source 14 and begin accelerating toward the drain 16. As electrons move along the length of the channel 20, the electrons gain energy and, upon attaining enough energy, jump over the potential barrier of the bottom dielectric layer 26 and into the charge storing layer 28 (within the respective charge storing cells 36, 38) where the electrons become trapped.

While conventional NOR architecture SONOS devices are capable of storing two bits per memory device, there is an ever increasing demand to store even more data per unit area of a memory core.

SUMMARY OF THE INVENTION

According to one aspect of the invention, the invention is directed to a non-volatile memory device. The memory device includes a source and a drain, which have a channel region therebetween. A bottom dielectric layer is formed over the channel region and a charge storing layer is formed over the bottom dielectric layer. The charge storing layer includes at least four charge storing cells. Sidewalls are disposed on opposite sides of the charge storing layer. A top dielectric layer is formed over the charge storing layer and a gate electrode is formed over the top dielectric layer. A first complementary conductive region is disposed adjacent the first sidewall of the charge storing layer and a second complementary conductive region is disposed adjacent a second sidewall of the charge storing layer.

According to another aspect of the invention, the invention is directed to a method of programming a memory device. The memory device can include a charge storing layer having at least four charge storing cells. The charge storing layer is disposed between a top dielectric layer and a bottom dielectric layer. A gate electrode is disposed over the top dielectric layer. The bottom dielectric layer is disposed over a substrate having a source, which is coupled to a first bitline, and a drain, which is coupled to a second bitline. First and second complementary bitlines, which are disposed on opposite sides of the charge storing layer, extend along a direction perpendicular to the first and second bitlines. The method includes programming a selected charge storing cell by applying a voltage potential to each of the gate electrode and the bitline and complementary bitline adjacent to the selected charge cell.

According to another aspect of the invention, the invention is directed to a method of reading a memory device. The memory device can include a charge storing layer having at least four charge storing cells. The charge storing layer is disposed between a top dielectric layer and a bottom dielectric layer. A gate electrode is disposed over the top dielectric layer. The bottom dielectric layer is disposed over a substrate having a source, which is coupled to a first bitline, and a drain, which is coupled to a second bitline. First and second complementary bitlines, which are disposed on opposite sides of the charge storing layer, extend along a direction perpendicular to the first and second bitlines. The method includes reading a selected charge storing cell by applying a voltage potential to each of the gate electrode and the bitline and complementary bitline opposite the selected charge storing cell and grounding the bitline adjacent to the selected charge storing cell.

According to another aspect of the invention, the invention is directed to a method of simultaneously erasing at least four charge storing cells within a memory device. The memory device can include a charge storing layer, which contains at least four charge storing cells, disposed between a top dielectric layer and a bottom dielectric layer. A gate electrode, which is formed from a wordline, is disposed over the top dielectric layer. The bottom dielectric layer is disposed over a substrate including a source, which is formed from a first bitline, and a drain, which is formed from a second bitline. First and second complementary bitlines, which are disposed on opposite sides of the charge storing layer, extend along a direction perpendicular to the first and second bitlines. The method includes applying a negative gate erase voltage of about −6 Volts or less to the wordline, applying a voltage of about +3 Volts or less to the first and second complementary bitlines, and coupling the first and second bitlines to a potential of about +6 Volts or less.

DESCRIPTION OF DRAWINGS

These and further features of the present invention will be apparent with reference to the following description and drawings, wherein.

DISCLOSURE OF INVENTION

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Figure 2:
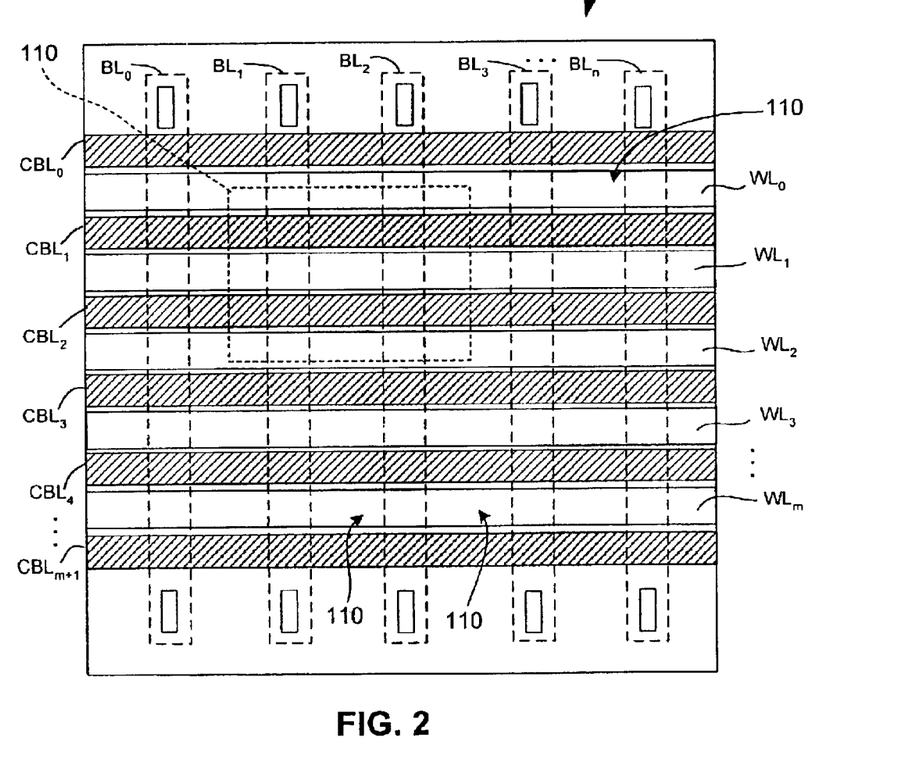
FIG. 2 is a top plan view of an array of memory cells including complementary bitlines in accordance with the present invention.

FIG. 2 illustrates an array 100 of flash electrically erasable programmable read only memory (EEPROM) devices or cells 110. The flash EEPROM memory array 100 is made up of rows and columns of multiple-bit, semiconductor/oxide-nitride-oxide on semiconductor (SONOS) type, non-volatile EEPROM memory cells 110. The memory cells 110 are operatively arranged with wordlines ($WL_0, WL_1, \ldots WL_m$) and bitlines ($BL_0, BL_1, \ldots BL_n$). As is described more fully below, the drains and the sources of the memory cells are formed from, connected to or otherwise coupled to the bitlines, while the gate electrodes are formed from, connected to or otherwise coupled to the wordlines. As is described more fully below, each memory cell 110 is associated with a pair of complementary bitlines ($CBL_0, CBL_1, \ldots CBL_p$), which run in a direction parallel to the wordlines ($WL_0, WL_1, \ldots WL_m$).

Figure 3:
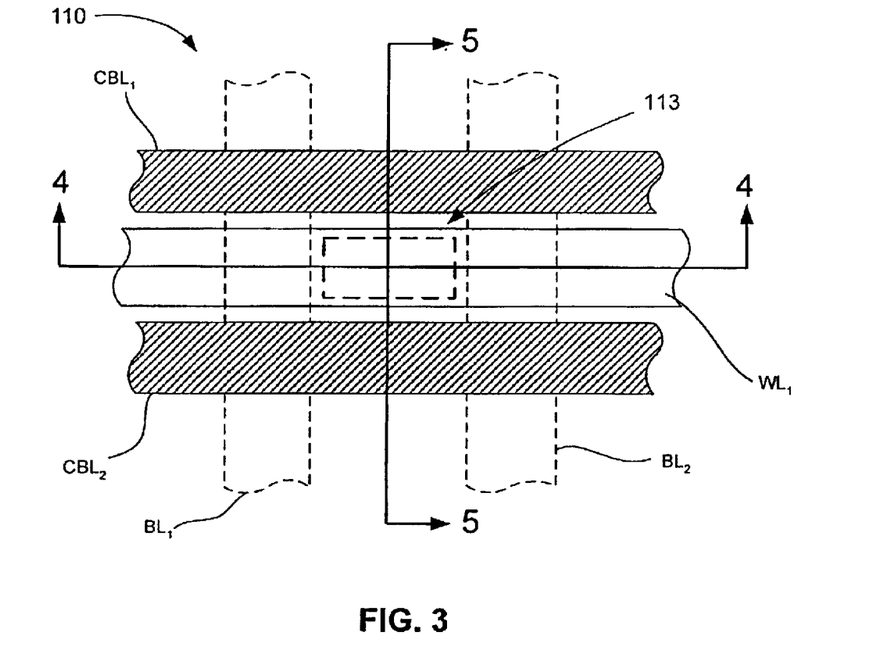
FIG. 3 is a top view of a portion of FIG. 2 illustrating a single memory cell in accordance with the present invention.

As shown in FIG. 3, each multiple-bit SONOS-type memory cell 110 includes a cell 113, which is associated with a wordline ($WL_1$), a pair of bitlines ($BL_1, BL_2$) and a pair of complementary bitlines ($CBL_1, CBL_2$). As is described more fully below, the memory cell 110 is operatively arranged to be programmed, read, and erased by the application of appropriate voltage potentials to wordline ($WL_1$), the bitlines ($BL_1, BL_2$), and the complimentary bitlines ($CBL_1, CBL_2$).

Figure 4:
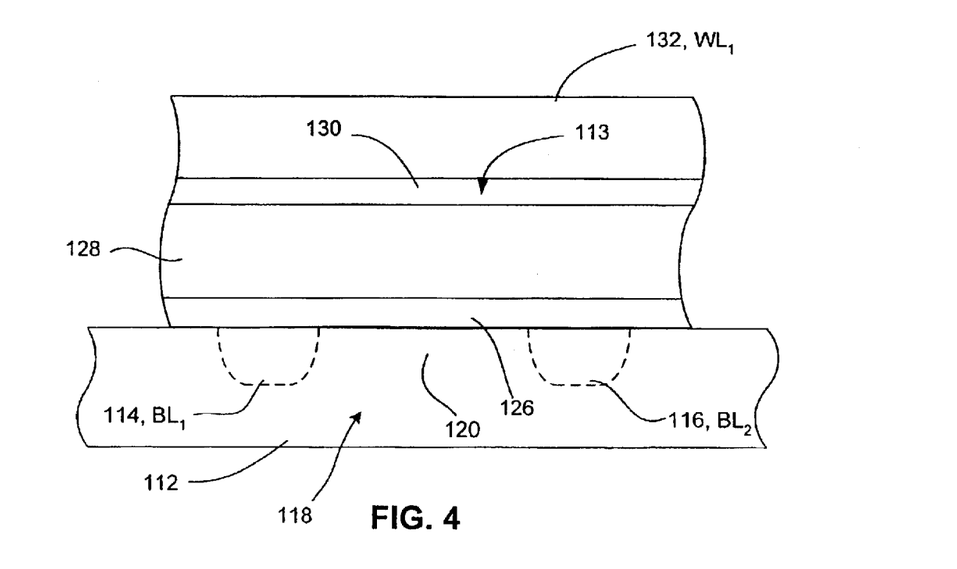
FIG. 4 is a schematic cross-section illustration of the memory cell of FIG. 3 taken along line 4—4.

With reference now to FIG. 4, the SONOS-type memory cell 110 includes a semiconductor substrate 112. In one embodiment, the substrate can initially be doped to have a P-type conductivity (i.e., P dopant concentration). Within the substrate 112, a source 114 and a drain 116 are formed. The source 114 can be coupled to or formed from the first bitline $BL_1$, while the drain can be coupled to or formed from the second bitline $BL_2$.

A body 118 is formed between the source 114 and the drain 116. The body 118 can have the same dopant type and concentration as the initial doping of the substrate 112. The substrate 112, the source 114, the drain 116, and the body 118 can be formed, for example from a semiconductor, such as appropriately doped silicon, germanium or silicon-germanium.

Above the body 118 is a dielectric layer (also referred to as a tunneling oxide layer or bottom dielectric layer 126) that is made from, for example, silicon oxide ($SiO_2$), other standard-K material (e.g., having a relative permittivity below ten) or a high-K material (e.g., having a relative permittivity, in one embodiment above ten, and in another embodiment above twenty). In one embodiment, the bottom dielectric layer 126 has a thickness of about 60 Å to about 120 Å. However, it is to be appreciated that other thicknesses may be employed.

Over the bottom dielectric layer 126 is a charge trapping layer (also referred to as a charge storing layer 128). The charge storing layer 128 can be made from, for example, a non-conductive material including silicon nitride ($Si_3N_4$), silicon oxide with varied polysilicon islands, implanted oxide and the like.

Over the charge storing layer 128 is another dielectric layer (also referred to as a top dielectric layer 130) made from a material such as, for example, silicon oxide, other standard-K material or a high-K material. The top dielectric layer can have a thickness of, for example, about 100 Å to about 120 Å. Over the top dielectric layer 130 is a gate electrode 132 made from, for example, polycrystalline silicon.

The gate electrode 132, the top dielectric layer 130, the charge storing layer 128 and the bottom dielectric layer 126 form a stacked gate. A work function of the stacked gate controls a channel 120 within the body 118. The channel 120 extends from the source 114 to the drain 116. As one skilled in the art will appreciate, modification to the stacked gate and formation of the source 114, the drain 116, and the channel 120 can be made. Such modifications can include changes to the physical arrangement of the device, materials used, doping parameters and the like.

Figure 5:
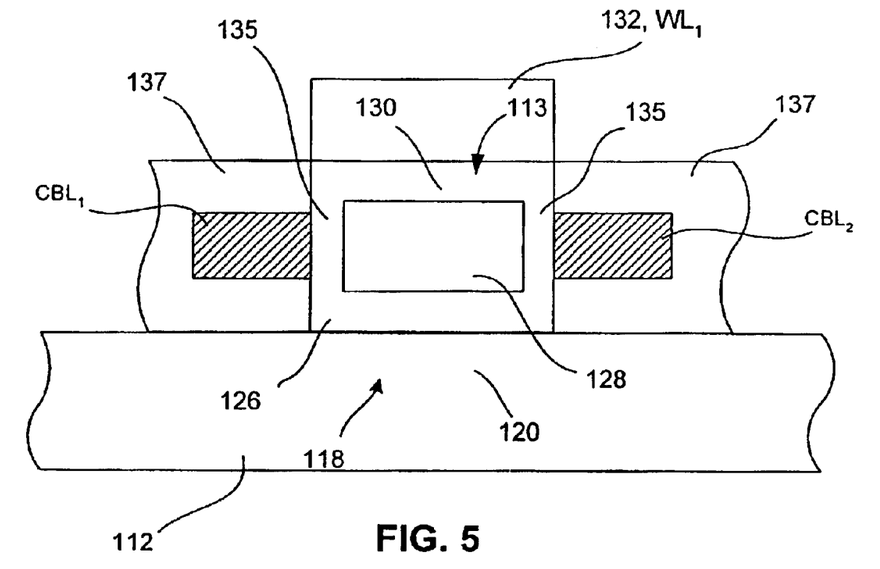
FIG. 5 is a schematic cross-section illustration of the memory cell of FIG. 3 taken along line 5—5.
Figure 6:
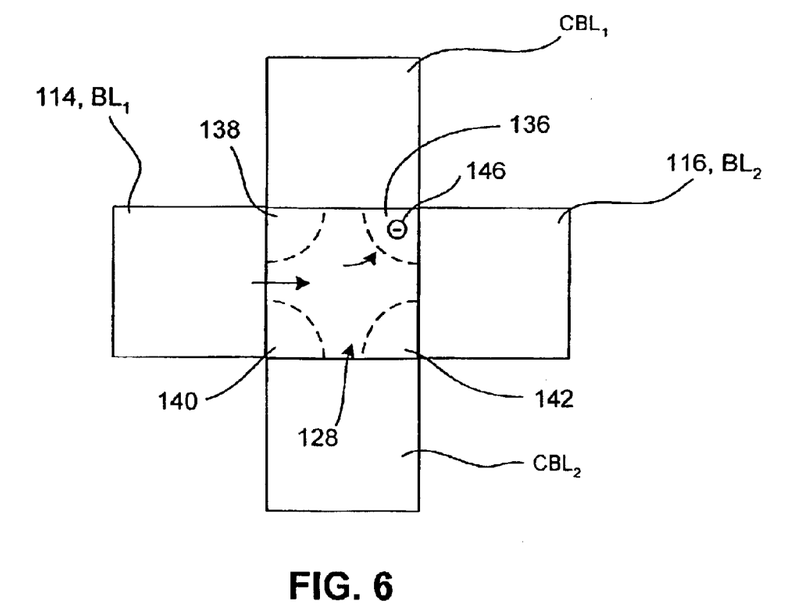
FIG. 6 is a top view block diagram of a memory cell illustrating the flow of electrons into one charge storing cell during a program operation in accordance with the present invention.

With reference now to FIG. 5 and continued reference to FIG. 4, in one embodiment, a first complementary bitline $CBL_1$ is disposed laterally adjacent one side of the charge storing layer 128 and a second complementary bitline $CBL_2$ is disposed laterally adjacent an opposite side of the charge storing layer 128. As shown, the first and second complementary bitlines $CBL_1, CBL_2$, vertically overlap with the charge storing layer 128. In this embodiment, the memory cell 110 includes additional insulating layers 137. The additional insulating layers 137 can be made from an oxide or other suitable material. In this embodiment, the additional insulating layers 137 serve to separate and electrically insulate the complementary bitlines $CBL_1$, $CBL_2$, from the first and second bitlines $BL_1$, $BL_2$ (shown in FIG. 4) and the substrate 112. Therefore, the insulating layers 137 could be considered an interdielectric layer (e.g., $ILD_0$). As is described more fully below, the first and second bitlines $BL_1$, $BL_2$ can be buried bitlines, which interchangeably serve as the source 114 and the drain 116. A pair of side insulators 135 can be disposed adjacent the sides of the charge storing layer 128. The side insulators 135 can be made from, for example, the same material as the top and bottom dielectric layers 130, 126, such that, in one example, the charge storing layer 128 is substantially surrounded by an oxide layer.

The memory device 110 is operatively arranged to be programmed, read and erased by the application of appropriate voltage potentials to each of the gate electrode 132, the source 114 and the drain 116. More specifically, as discussed above, the gate electrode 132 can be coupled to or formed from the wordline $WL_1$, the source 114 can be coupled to or formed from the first bit line $BL_1$ and the drain 116 can be coupled to or formed from the second bit line $BL_2$ for applying the various voltage potentials to the corresponding components of the memory device 110.

In one embodiment, the memory device 110 can be configured as a virtual ground device. That is, the memory device 110 can be connected in series with adjacent memory devices such that the first bitline $BL_1$, which serves as the source 114, can be formed from a conductive region that also serves as a drain of an adjacent memory device. Similarly, the second bitline $BL_2$, which serves as the drain 116, can be formed from a conductive region that also serves as the source of a memory device disposed adjacent the drain 116 side of the memory device 110. It is noted that the source and drain of adjacent memory devices need not be formed from a single conductive region, but can be formed from separate structures that are electrically connected together (e.g., a pair of conductive regions spaced apart by a trench isolation region and connected by a conductive layer, such as silicide).

Figure 7:
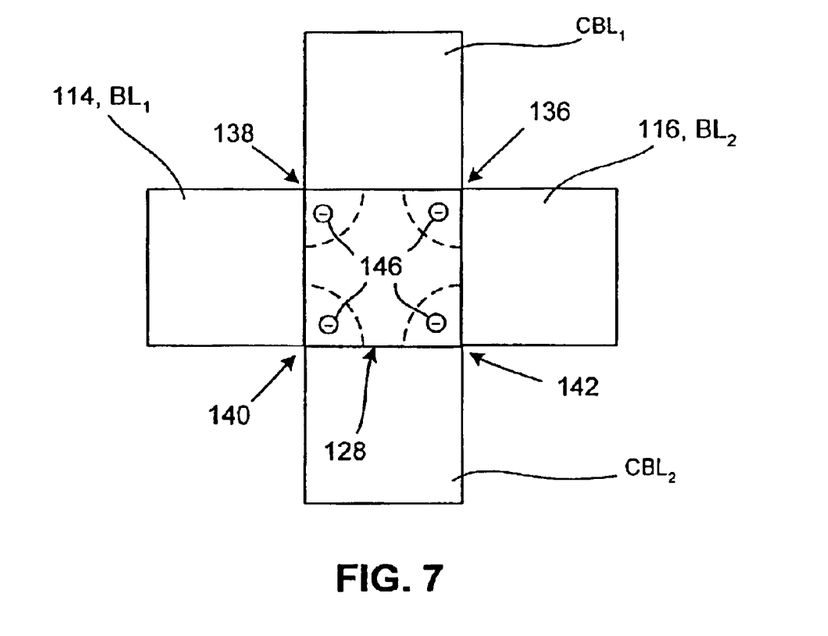
FIG. 7 is a top view block diagram of a memory cell having four charge storing cells in accordance with the present invention.

FIG. 7 illustrates a top schematic view of a multiple-bit memory cell 110 in accordance with one embodiment of the present invention. As will become more apparent from the discussion below, within the charge storing layer 128, the memory device 110 includes at least four charge storing regions or cells. More particularly, the charge storing layer 128 includes at least a first charge storing cell 136, a second charge storing cell 138, and third charge storing cell 140, and a fourth charge storing cell 142, as shown.

In the illustrated embodiment, the memory device 110 is a generally symmetrical device allowing for programming, reading and erasing of the first cell 136 and the second cell 138 by respectively switching the roles of the source 114 and the drain 116 during those operations. Likewise, the memory device 110 allows for programming, reading, and erasing of the third cell 140 and the fourth cell 142 by respectively switching the roles of the source 114 and the drain 116 during those operations. For example, the first bitline $BL_1$ may serve as the source terminal 114 and the second bitline $BL_2$ may serve as the drain terminal 116 when programming the first bit 136 and the fourth bit 142 (depending upon the preferential biasing of the first and second complementary bitlines $CBL_1$, $CBL_2$). Likewise, the second bitline $BL_2$ may serve as the source terminal and the first bitline $BL_1$ may serve as the drain terminal for programming the second and third bits 138, 140 (depending upon the preferential biasing of the first and second complementary bitlines $CBL_1$, $CBL_2$).

A method of programming the four or more charge storing cells (136, 138, 140, 142) from a blank state (e.g., representing a binary value of "1") to a charged state (e.g., representing a binary value of "0") will be described. It is noted that the blank state corresponds to an amount of charge being stored by the charge storing cell 136, 138, 140, 142 that, during a read operation, would place a threshold voltage (Vt) of the memory cell 110 equal to or less than an erase threshold voltage and within an erase state threshold voltage distribution. The programmed state corresponds to an amount of charge being stored by the charge storing cell 136, 138, 140, 142 that, during the read operation, would place the threshold voltage of the memory cell 110 within a threshold voltage distribution that is higher than the erase threshold voltage and within a programmed state threshold distribution. In one embodiment, the memory cell 110 can be programmed using multi-level cell (MLC) programming. MLC programming can be accomplished by programming each charge storage cell 136, 138, 140, 142 with an amount of charge selected from one of a plurality of distinguishable amounts of charge, referred to as program levels.

In one embodiment, the programming technique involves hot electron injection. However, other programming techniques, such as hot hole injection, carrier tunneling and so forth are meant to fall within the scope of the present invention.

Using the hot electron injection technique to program the first charge storing cell 136, appropriate voltage potentials are applied to the first bitline $BL_1$ (which serves as the source 114), the second bitline $BL_2$ (which serves as the drain 116), the complementary bitlines $CBL_1$, $CBL_2$ and/or the wordline $WL_1$ (which serves as the gate electrode 132). The applied potentials generate a vertical electric field through the dielectric layers 126, 130 and the charge storing layer 128 and a lateral electric field along the length of the channel 120 from the source 114 to the drain 116. In addition, the voltage potentials applied to either or both of the complementary bitlines $CBL_1$, $CBL_2$ generate an electric field between these two complementary bitlines and perpendicular to the lateral electric field. The combined effect of the electric fields serves to select the charge storing cell into which electrons 146 are injected.

The lateral electric field causes electrons 146 to be drawn off the source 114 and begin accelerating toward the drain 116 (as shown by the arrows in FIG. 7). As the electrons move along the length of the channel 120, the electrons 146 gain energy and, upon obtaining enough energy, the electrons 146 are able to jump over the potential barrier of the bottom dielectric layer 126 and into the charge storing layer 128, where the electrons become trapped.

The probability of electrons 146 jumping the potential barrier is a maximum adjacent the drain 116, (e.g., in the area of the first charge storing cell 136 or the fourth charge storing cell 142 adjacent the drain 116) where the electrons have gained the most energy. By preferential biasing of one or both of the complementary bitlines $CBL_1$, $CBL_2$ the perpendicular electric field is generated therebetween, which directs the electron into either the first charge storing cell 136 or the fourth charge storing cell 142. These accelerated electrons are termed hot electrons and, once injected into the charge storing layer 128, stay in the desired or selected charge storing cell 136, 142 of the charge storing layer 128. The trapped electrons 146 tend not to spread through the charge storing layer 128 due to this layer's low conductivity and low lateral electric field therein. Thus, the trapped charge 146 remains in the localized trapping region of the first charge storing cell 136 close to the drain 116 and the first complementary CBL$_1$ or the fourth charge storing cell 142 close to the drain 116 and the second complementary bitline CBL$_2$.

The foregoing technique to program the charge storing cells 136, 142 can be used to program the second charge storing cell 138 or the third charge storing cell 140, but the functions of the source 114 and the drain 116 are reversed. More specifically, appropriate voltage potentials are applied to the first bitline BL$_1$ (which serves as the drain), the second bitline BL2 (which serves as the source), the complementary bitlines CBL$_1$, CBL$_2$, and/or the wordine WL$_1$ (which serves as the gate electrode 132), such that the drain 116 functions as a source of electrons 146 that travel along the channel 120 from the drain 116 towards the source 114. Accordingly, the terms source and drain can be used interchangeably. As the electrons move along the length of the channel 120, the electrons 146 gain energy and, upon obtaining enough energy, the electrons 146 are able to jump over the potential barrier of the bottom dielectric layer 126 and into the second charge storing cell 138 or the third charge storing cell 140 of the charge storing layer 128 where the electrons become trapped. The probability of the hot electrons jumping the potential barrier is a maximum in the area of the charge storing layer 128 adjacent to the source 114 where the electrons 146 have gained the most energy.

Table 1 includes exemplary voltage potentials that can be applied to the wordline WL$_1$ (gate electrode 132), the bitlines BL$_1$, BL$_2$ (the source 114 and the drain 116), and the complementary bitlines CBL$_1$, CBL$_2$ to program the charge storage regions or cells 136, 138, 140, 142. In one embodiment, the exemplary voltage potentials provided in Table 1 are applied as pulses having a duration between about 0.5 μs and about 10 μs. It is noted that the values presented in Table 1 will vary depending on the specific characteristics of the memory device being programmed.

TABLE 1

|  | WL$_1$ Voltage | BL$_1$ Voltage | BL$_2$ Voltage | CBL$_1$ Voltage | CBL$_2$ Voltage |
| --- | --- | --- | --- | --- | --- |
| First Cell | 8–10 V | 0 V | 4–6 V | 2–4 V | Float |
| Second Cell | 8–10 V | 4–6 V | 0 V | 2–4 V | Float |
| Third Cell | 8–10 V | 4–6 V | 0 V | Float | 2–4 V |
| Fourth Cell | 8–10 V | 0 V | 4–6 V | Float | 2–4 V |

Figure 8:
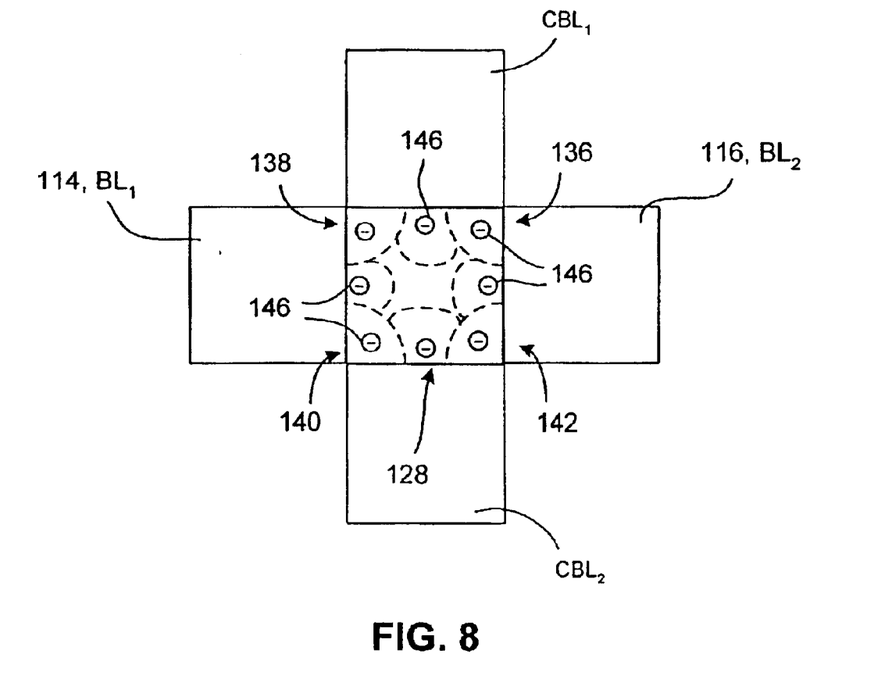
FIG. 8 is a top view block diagram of a memory cell having eight charge storing cells in accordance with an alternate embodiment of the present invention.

FIG. 8 provides a schematic illustration of a memory device 110 in which all four charged storing cells 136, 138, 140, 142 are in a programmed or charged state (e.g., representing a binary value of "0"). In an alternate embodiment, shown in FIG. 8 while not intending to be bound by theory, a memory device 110 may include a charge storing layer 128 having greater than four charge storing cells. For example, as shown in FIG. 8, the charge storing layer may include up to eight charge storing cells (the relative position of each charge storing cell being shown by the presence of charge 146). As is described more fully above, a hot electron injection technique may be used along with preferential biasing of one or both complementary bitlines CBL$_1$, CBL$_2$ in order to selectively inject charge into one or more of the eight illustrated charge storing cells.

Referring again to FIG. 8, verifying the programming of the memory device 110 and reading of the memory device 110 can be carried out by the application of appropriate voltage potentials. For example, in order to read or otherwise verify the second charge storing cell 138, voltages can be applied to the gate electrode 132 (e.g., about 4 Volts to about 5 Volts), the second bitline BL$_2$ (e.g., about 1 Volt to about 2 Volts), and the second complementary bitline CBL$_2$ (e.g., about 2 Volts to about 3 Volts) and the first bitline BL$_1$ can be grounded. The application of these voltages effectively screens out all charges shown in charge storing layer 128 except for those within the second charge storing cell 138. Similarly, for example, the third charge storing cell 140 may be read by applying similar voltages to the gate electrode 132, the second bitline BL$_2$, and the first complementary bitline CBL$_1$, while allowing the first bitline BL$_1$ to be grounded or to function as a virtual ground.

With continued reference to FIG. 8, simultaneous erasing of the charge storing cells 136, 138, 140, 142 may be accomplished by applying a negative gate erase voltage to the wordline WL$_1$ (e.g., about –6 Volts or less), while applying a positive voltage (e.g., about +3 Volts) to both complementary bitlines CBL$_1$, CBL$_2$ and (e.g., about +5 Volts) to both bitlines BL$_1$, BL$_2$.

With continued reference to FIGS. 3, 4, and 5, one method of fabricating the memory device 110 will be described in greater detail. As indicated, a semiconductor substrate 112 is provided. The semiconductor substrate 112 can be initially doped with P-type dopant, such as boron, gallium or indium. As indicated above, the initial substrate 112 doping can provide the desired conductivity for the body 118.

In one embodiment, buried bitlines BL$_1$, BL$_2$ are formed within the substrate 112 by appropriate ion implantation. One or more suitable implantation materials may be employed. The selection of implantation materials primarily depends upon the type of substrate employed, for example, whether a P-type or N-type is used. Examples of implantation materials for N-type conductivity include one or more of arsenic, antimony, and phosphorus.

A layer of material used to form the bottom dielectric layer 126 can be grown or deposited on top of the substrate 112. The bottom dielectric layer 126 can be made from, for example, silicon oxide (SiO$_2$) or another standard-K material (e.g., having a relative permittivity below 10) or a high-K material (e.g., having a relative permittivity in one embodiment above 10, and in one embodiment above 20). Preferably, the bottom dielectric layer 126 will have a thickness of about 60 Å to about 120 Å. It is noted that the bottom dielectric layer can optionally be used as an implant screen during the implantation of dopant species into the substrate 112. In this instance, the bottom dielectric layer can be formed before initial substrate implantation and/or bitline formation.

Following formation of the bottom dielectric layer 126, a layer of material used to form the charge storing layer 128 can be formed on the bottom dielectric layer 126. In one embodiment, the charge storing layer 128 can be formed from silicon nitride. Other suitable dielectric materials may also for the charge storing layer 128. The charge storing layer 128 can be patterned to form the individual cells 113. In one embodiment, the side insulators 135 can be formed adjacent sidewalls of the cells.

In one embodiment in which the complementary bitlines CBL$_1$, CBL$_2$ are disposed vertically even with the charge storing layer 128, the complementary bitlines may be formed on top of one or more oxide insulating layers 137, which separate the complementary bitlines from the buried bitlines. The complementary bitlines can be made of silicide or another suitable conductive deposit on top of the oxide layer 137. Preferably, the complementary bitlines are further covered by additional oxide insulation 137, electrically insulating the complementary bitlines from the wordlines WL$_1$. It is to be appreciated that the formation of the complementary bitlines may occur at numerous points during the memory device formation process. Also, side insulators 135 and bottom oxide 130 can be formed in one layer in which trenches for complementary bitlines are formed.

On top of the charge storing layer 128, a top dielectric layer 130 can be formed. The additional top insulating layer 137 could be made from the top dielectric layer 130. Similar to the bottom dielectric layer 126, the top dielectric layer 130 can be made from an appropriate dielectric such as silicon oxide or a high-K material. High-K materials are materials having, in one embodiment, a relative permittivity of ten or higher and, in another embodiment, of 20 or higher. Suitable high-K materials include aluminum oxide (e.g., $Al_2O_3$), hafnium oxide (e.g., $HfO_2$), zirconium oxide (e.g., $ZrO_2$), and their respective silicates, and all binary and ternary metal oxides and ferroelectric materials having a K higher than, in one embodiment, about ten (10). The top dielectric layer 130 can have a thickness comparable to the thickness of the bottom dielectric layer 126.

On top of the top dielectric layer 130, a gate electrode layer 132 can be formed. The gate electrode layer 132 (also referred to herein as the wordline $WL_1$ layer) can be made from, for example, polycrystalline silicon ("poly") or another appropriate material, such as a metal, metal oxide, or metal containing compound (e.g., a silicide). The gate electrode layer 132 may be doped with an appropriate dopant.

It is to be appreciated that other suitable processing methods may be employed, including, but not limited to those disclosed and co-owned U.S. Patent Application Publication No. US200210063277 and co-owned U.S. Pat. No. 6,417,081 both of which are incorporated by reference in their entirety.

Although particular embodiments of the invention have been described in detail, it is understood that the invention is not limited correspondingly in scope, but includes all changes, modifications and equivalents coming within the spirit and terms of the claims appended hereto.

What is claimed is:

1. A non-volatile memory device comprising:
   a source and a drain having a channel region therebetween;
   a bottom dielectric layer formed over the channel region;
   a charge storing layer formed over the bottom dielectric layer, said charge storing layer effectively having at least four charge storing cells and having sidewalls disposed on opposite sides of the charge storing layer;
   a top dielectric layer formed over the charge storing layer;
   a gate electrode formed over the top dielectric layer;
   a first complementary conductive region disposed adjacent a first sidewall of the charge storing layer; and
   a second complementary conductive region disposed adjacent a second sidewall of the charge storing layer.

2. The memory device according to claim 1, wherein the gate electrode is formed from a wordline.

3. The memory device according to claim 2, wherein the first complementary conductive region is formed from a first complementary bitline and the second complementary conductive region is formed from a second complementary bitline, said first and second complementary bitlines extending along a direction substantially parallel to the wordline.

4. The memory device according to claim 3, wherein the wordline is disposed laterally between the first and second complementary bitlines.

5. The memory device according to claim 1, wherein the source is formed from a first bitline and the drain is formed from a second bitline.

6. The memory device according to claim 5, wherein the first complementary conductive region is formed from a first complementary bitline and the second complementary conductive region is formed from a second complementary bitline, said first and second complementary bitlines extending along a direction perpendicular to the first and second bitlines.

7. The memory device according to claim 6, wherein the first and second complementary bitlines are disposed vertically above and electrically insulated from each of the first and second bitlines.

8. The memory device according to claim 5, wherein the charge storing layer includes:
   a first charge storing cell disposed adjacent both the second bitline and the first complementary conductive region;
   a second charge storing cell disposed adjacent both the first bitline and the first complementary conductive region;
   a third charge storing cell disposed adjacent both the first bitline and the second complementary conductive region; and
   a fourth charge storing cell disposed adjacent both the second bitline and the second complementary conductive region.

9. The memory device according to claim 8, wherein the first charge storing cell is charged by applying a voltage potential to each of the gate electrode, the second bitline and the first complementary conductive region.

10. The memory device according to claim 8, wherein the source, the drain, the gate electrode and the first and second complementary conductive regions are effective to inject charge into the first charge storing cell when a voltage potential is applied to each of the gate electrode, the second bitline and the first complementary conductive region.

11. The memory device according to claim 5, wherein the first and second bitlines are buried bitlines.

12. The memory device according to claim 1, wherein the first complementary conductive region is formed from a first complementary bitline and the second complementary conductive region is formed from a second complementary bitline.

13. The memory device according to claims 12, wherein, the first and second complementary bitlines comprise a silicide formed over an oxide layer.

14. The memory device according to claim 1, wherein the first and second complementary conductive regions are disposed at a vertical height that overlap with the vertical height of the charge storing layer.

15. The memory device according to claim 1, wherein the charge storing layer is substantially surrounded by dielectric material.

16. A method of programming a memory device having a charge storing layer with at least four charge storing cells, the charge storing layer being disposed between a top dielectric layer and a bottom dielectric layer, a gate electrode disposed over the top dielectric layer, the bottom dielectric layer disposed over a substrate having a source coupled to a first bitline and a drain coupled to a second bitline, and a first complementary bitline and a second complementary bitline disposed on opposite sides of the charge storing layer, the first and second complementary bitlines extending along a direction perpendicular to the first and second bitlines, said method comprising:
   programming a selected charge storing cell by:
      applying a voltage potential to each of the gate electrode and the bitline and complementary bitline adjacent the selected charge storing cell.

17. The method according to claim 16, wherein the voltage potential applied to the gate electrode is in the range of about 8 Volts to about 10 Volts.

18. The method according to claim 17, wherein the voltage applied to the bitline is in the range of about 4 Volts to about 6 Volts.

19. The method according to claim 18, wherein the voltage applied to the complementary bitline is in the range of about 2 Volts to about 4 volts.

20. The method according to claim 16, further comprising:

injecting charge between two of the charge storing cells to form an additional charge storing cell.

21. A method of reading a memory device having a charge storing layer with at least four charge storing cells, the charge storing layer being disposed between a top dielectric layer and a bottom dielectric layer, a gate electrode disposed over the top dielectric layer, the bottom dielectric layer disposed over a substrate having a source coupled to a first bitline and a drain coupled to a second bitline, and a first complementary bitline and a second complementary bitline disposed on opposite sides of the charge storing layer, the first and second complementary bitlines extending along a direction perpendicular to the first and second bitlines, said method comprising:

reading a selected charge storing cell by:
      applying a voltage potential to each of the gate electrode and the bitline and complementary bitline opposite the selected charge storing cell; and
      grounding the bitline adjacent the selected charge storing cell.

22. The method according to claim 21, wherein:

the voltage potential applied to the gate electrode is in the range of about 4 Volts to about 5 Volts; and the voltage applied to each of the bitline and the complementary bitline opposite the selected cell is about 1 Volt to about 3 Volts.

23. In a memory device having a charge storing layer with at least four charge storing cells, the charge storing layer being disposed between a top dielectric layer and a bottom dielectric layer, a gate electrode formed from a wordline disposed over the top dielectric layer, the bottom dielectric layer disposed over a substrate having a source formed from a first bitline and a drain formed from a second bitline, and a first complementary bitline and a second complementary bitline disposed on opposite sides of the charge storing layer, the first and second complementary bitlines extending along a direction perpendicular to the first and second bitlines, a method of simultaneously erasing the at least four charge storing cells comprising:

applying a negative gate erase voltage of about −6 volts or less to the wordline; and coupling the first and second bitlines and the first and second complementary bitlines to a potential of about 3 Volts to about 5 Volts.

* * * * *

UNITED STATES PATENT AND TRADEMARK OFFICE
CERTIFICATE OF CORRECTION

PATENT NO.    : 6,735,124 B1
DATED         : May 11, 2004
INVENTOR(S)   : Melik-Martirosian et al.

It is certified that error appears in the above-identified patent and that said Letters Patent is hereby corrected as shown below:

Column 10,
Line 42, replace "claims" with -- claim --.
Line 47, replace "overlap" with -- overlaps --.

Signed and Sealed this

Thirtieth Day of November, 2004

JON W. DUDAS
*Director of the United States Patent and Trademark Office*